US009055180B2

(12) United States Patent
Fukunaga

(10) Patent No.: US 9,055,180 B2
(45) Date of Patent: Jun. 9, 2015

(54) COLOR SENSOR FOR ACCURATELY DETECTING COLOR COMPONENTS

(75) Inventor: Yasuhiro Fukunaga, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 425 days.

(21) Appl. No.: 12/953,660

(22) Filed: Nov. 24, 2010

(65) Prior Publication Data

US 2011/0122302 A1    May 26, 2011

(30) Foreign Application Priority Data

Nov. 25, 2009   (JP) .................................. 2009-267707

(51) Int. Cl.
*H04N 9/04*       (2006.01)
*H01L 27/146*     (2006.01)
*H04N 5/33*       (2006.01)
*H04N 5/345*      (2011.01)
*H04N 5/335*      (2011.01)
*H04N 5/359*      (2011.01)

(52) U.S. Cl.
CPC .......... *H04N 9/045* (2013.01); *H01L 27/14647* (2013.01); *H04N 5/332* (2013.01); *H04N 5/3458* (2013.01); *H04N 5/335* (2013.01); *H01L 27/14621* (2013.01); *H04N 5/359* (2013.01)

(58) Field of Classification Search
None
See application file for complete search history.

(56) References Cited

U.S. PATENT DOCUMENTS

| 2004/0095489 A1* | 5/2004 | Hirose .......................... 348/262 |
| 2005/0001542 A1* | 1/2005 | Kiguchi ......................... 313/504 |
| 2006/0203100 A1* | 9/2006 | Ajito et al. ................... 348/220.1 |
| 2006/0208981 A1* | 9/2006 | Rho et al. ........................ 345/88 |

FOREIGN PATENT DOCUMENTS

| JP | 58-125867 A | 7/1983 |
| JP | 63-36123 A | 2/1988 |
| JP | 04-225676 A | 8/1992 |
| JP | 2004-064413 A | 2/2004 |
| JP | 2008-98601 A | 4/2008 |

OTHER PUBLICATIONS

Japanese Office Action dated Oct. 8, 2013, issued in corresponding Japanese Patent Application No. 2009-267707, w/English translation.
Office Action dated Jun. 3, 2014, issued in corresponding Japanese Patent Application No. 2009-267707, with English Translation (5 pages).

* cited by examiner

*Primary Examiner* — Justin P Misleh
(74) *Attorney, Agent, or Firm* — Westerman, Hattori, Daniels & Adrian, LLP

(57) ABSTRACT

A pixel that detects short-wavelength light is provided in a light receiving unit on a silicon substrate and has a first color filter. A pixel that detects long-wavelength light is provided in the light receiving unit on the silicon substrate, is provided in a position closer to an outer edge of the light receiving unit than the pixel that detects the short-wavelength light, and has a second color filter. A longest-wavelength transmission band of the first color filter is a first transmission band, and the longest-wavelength transmission band of the second color filter is a second transmission band. The second transmission band has a longer wavelength than the first transmission band.

6 Claims, 7 Drawing Sheets

RELATIONSHIP BETWEEN WAVELENGTH OF LIGHT
AND ABSORPTION DEPTH WITHIN SILICON

PRIOR ART

PRIOR ART

US 9,055,180 B2

COLOR SENSOR FOR ACCURATELY DETECTING COLOR COMPONENTS

BACKGROUND OF THE INVENTION

1. Field of the Invention

The present invention relates to a color sensor that detects color components.

This application claims priority to and the benefits of Japanese Patent Application No. 2009-267707 filed on Nov. 25, 2009, the disclosure of which is incorporated herein by reference.

2. Background Art

When various scenes are photographed by a photographing device such as a digital camera or a digital video camera in which a solid-state imaging element is mounted, photographing is performed under various illuminating light sources. A technique is known in which a color sensor is mounted along with an imaging element, a type of photographing light source is accurately identified, and good white balance is implemented regardless of the light source under which photographing is performed.

FIG. 13 is a cross-sectional view of a color sensor of the related art. In an example shown, the color sensor includes a first color filter 81, a second color filter 82, a third color filter 83, a silicon substrate 84, a first photodiode 85, a first separation layer 86, a second photodiode 87, a second separation layer 88, and a third photodiode 89. A portion covered by the first color filter 81 becomes a first pixel, a portion covered by the second color filter 82 becomes a second pixel, and a portion covered by the third color filter 83 becomes a third pixel.

For example, the first color filter 81 is a color filter that transmits red light and is arranged to cover the first pixel. For example, the second color filter 82 is a color filter that transmits blue light and is arranged to cover the second pixel. For example, the third color filter is a color filter that transmits light having a green light and is arranged to cover the third pixel.

The first photodiode 85 is a photoelectric conversion element that photoelectrically converts light incident through the first color filter 81, and is arranged on the silicon substrate 84. The second photodiode 87 is a photoelectric conversion element that photoelectrically converts light incident through the second color filter 82, and is arranged on the silicon substrate 84. The third photodiode 89 is a photoelectric conversion element that photoelectrically converts light incident through the third color filter 83, and is arranged on the silicon substrate 84.

The first separation layer 86 separates the first pixel and the second pixel. The second separation layer 88 separates the second pixel and the third pixel. By this configuration, the first, second, and third pixels can respectively detect different color lights. Thereby, the color sensor can detect incident light components. For example, if the color sensor of this configuration is used in a digital camera or the like, the digital camera can identify a type of light source on the basis of the light components detected by the color sensor.

A color sensor is known which has a pixel having sensitivity to light of a wavelength of 500 to 530 nm as a fourth pixel as well as the pixels having sensitivities to wavelength bands of color lights of red (R), green (G), and blue (B) (for example, see Japanese Unexamined Patent Application Publication No. 2004-64413).

FIG. 14 is a graph showing relative the sensitivity of light detected by a pixel having sensitivity to a wavelength band of red light, the relative sensitivity of light detected by a pixel having sensitivity to a wavelength band of green light, the relative sensitivity of light detected by a pixel having sensitivity to a wavelength band of blue light, and the relative sensitivity of light detected by a fourth pixel.

As shown, the pixel having the sensitivity to the wavelength band of the blue light detects most light whose wavelength is about 455 nm. The pixel having the sensitivity to the wavelength band of the green light detects most light whose wavelength is about 540 nm. The pixel having the sensitivity to the wavelength band of the red light detects most light whose wavelength is about 620 nm. The fourth pixel detects light whose wavelength is 500 to 530 nm. Thus, the color sensor has the fourth pixel that detects light of a wavelength other than wavelengths of most lights to be detected by the pixels having sensitivities to wavelength bands of color lights of R, G, and B, thereby detecting light components with higher accuracy.

In the color sensor of the related art, crosstalk (wraparound of a charge) occurs in the photoelectric conversion element (a photodiode). Thereby, there is a problem in that the accuracy of light component detection by the color sensor is degraded.

Hereinafter, the crosstalk occurring in the photoelectric conversion element of the color sensor will be described. FIG. 15 is a schematic diagram illustrating the crosstalk occurring in the photoelectric conversion element of the color sensor. In an example shown, the color sensor includes a first color filter 91, a second color filter 92, a silicon substrate 93, a first photodiode 94, a second photodiode 95, and a separation layer 96. A portion covered by the first color filter 91 becomes a first pixel, and a portion covered by the second color filter 92 becomes a second pixel.

For example, the first color filter 91 is a color filter that transmits long-wavelength light, and is arranged to cover the first pixel. For example, the second color filter 92 is a color filter that transmits short-wavelength light, and is arranged to cover the second pixel. The photodiode 94 of the first pixel is a photoelectric conversion element that photoelectrically converts light incident through the first color filter 91, and is arranged on the silicon substrate 93. The photodiode 95 of the second pixel is a photoelectric conversion element that photoelectrically converts light incident through the second color filter 92, and is arranged on the silicon substrate 93. The separation layer 96 separates the first pixel and the second pixel.

In the photoelectric conversion element configured as described above, for example, the first photodiode 94 generates a photo charge 97 in a deep position of the silicon substrate 93 if the first color filter 91 transmits the long-wavelength light. The photo charge 97 generated in the deep position of the silicon substrate 93 is diffused like photo charges 97-1 to 97-3, and wraps around into the second photodiode 95. Thus, the second photodiode 95 detects the photo charge 97 generated by the first photodiode 94. There is a problem in that the accuracy of light component detection of the color sensor is degraded by the above-described crosstalk.

An object of the present invention is to provide a color sensor capable of suppressing the degradation of detection accuracy of light components due to the effect of crosstalk and detecting the light components with higher accuracy.

DISCLOSURE OF THE INVENTION

The present invention provides a color sensor including: a first pixel provided in a sensor unit on a silicon substrate and having a first color filter; and a second pixel provided in the sensor unit on the silicon substrate, provided in a position closer to an outer edge of the sensor unit than the first pixel, and having a second filter. The longest-wavelength transmission band of the first color filter is a first transmission band, the longest-wavelength transmission band of the second color filter is a second transmission band, and the second transmission band has a longer wavelength than the first transmission band.

In the color sensor of the present invention, the second color filter further has a third transmission band, and the third transmission band has a shorter wavelength than the second transmission band.

In the color sensor of the present invention, the second pixel further has a third color filter arranged to overlap the second color filter, and a transmission band of the third color filter has a shorter wavelength than the second transmission band.

The present invention further includes a third pixel provided in the sensor unit on the silicon substrate, provided in a position closer to the outer edge of the sensor unit than the first pixel and farther from the outer edge of the sensor unit than the second pixel, and having a third color filter. The longest-wavelength transmission band of the third color filter is a third transmission band, and the third transmission band has a longer wavelength than the first transmission band and has a shorter wavelength than the second transmission band.

In the color sensor of the present invention, transmittance of the first color filter is lower than that of the second color filter.

In the color sensor of the present invention, impurities are included in the silicon substrate, and the impurities decrease specific resistance of the silicon substrate compared to the case where the impurities are not included.

In the color sensor of the present invention, the pixel that detects the long-wavelength light is arranged on a more outer side within the sensor unit than the pixel that detects the short-wavelength light. By this configuration, a crosstalk charge generated by the pixel which detects the long-wavelength light that easily generates the crosstalk charge is easily discharged outside the sensor unit. Thus, the color sensor can suppress the degradation of detection accuracy of light components due to the effect of crosstalk, and can detect the light components with higher accuracy.

PREFERRED EMBODIMENTS

First Embodiment

Figure 1:
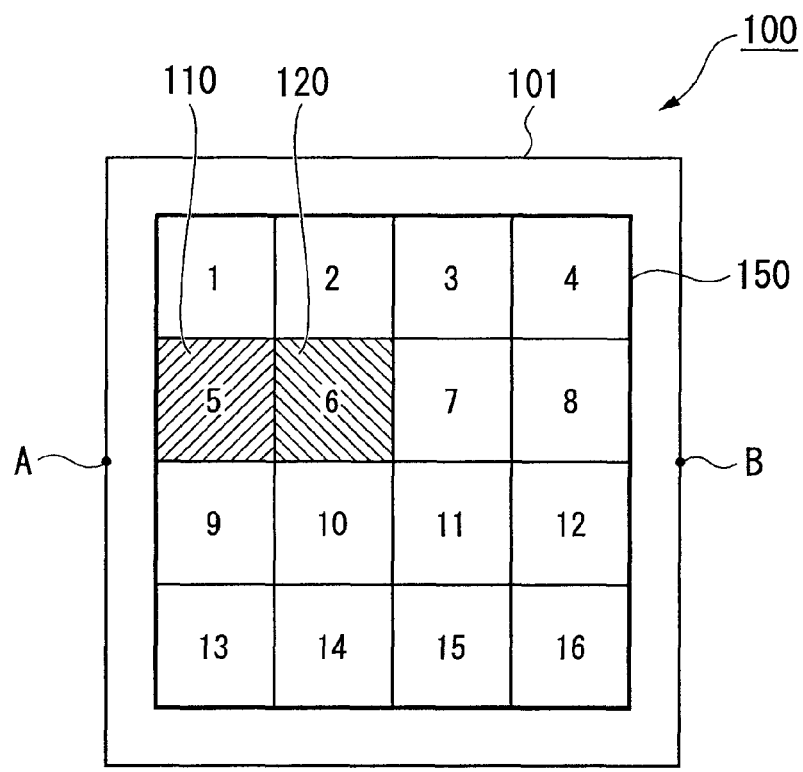
FIG. 1 is a schematic diagram showing an arrangement of pixels provided in a color sensor according to a first embodiment of the present invention.

Hereinafter, the first embodiment of a color sensor of the present invention will be described with reference to the drawings. FIG. 1 is a schematic diagram illustrating an arrangement of pixels provided in the color sensor according to this embodiment. In a shown example, a color sensor 100 has 16 pixels provided on a silicon substrate 101. A region where the 16 pixels are provided becomes a light receiving unit 150 (a sensor unit).

For description, numbers from No. 1 to No. 16 in order from top left to bottom right are respectively assigned to the pixels provided in the shown color sensor 100. Specifically, a top-left pixel number is No. 1, and the pixel number next to and to the right of the pixel No. 1 is No. 2. Other pixel numbers are the same as shown.

In the shown example, a pixel No. 5 is a pixel 110 (a second pixel), which detects long-wavelength light. A pixel No. 6 is a pixel 120 (a first pixel), which detects short-wavelength light. Thus, the pixel 110 that detects the long-wavelength light is arranged on a more outer side within the light receiving unit 150 than the pixel 120 that detects the short-wavelength light. Pixel No. 1 to 4 and No. 7 to 16 are pixels that each detect specific wavelength lights.

In the color sensor 100 configured as described above, each of the pixels detects a specific wavelength of light. Thus, it is possible to detect the intensity of light of each wavelength included in incident light. Thus, a digital camera or the like having a color sensor can determine the type of incident light (for example, sunlight or light of a fluorescent lamp) on the basis of the intensity of each wavelength.

Figure 2:
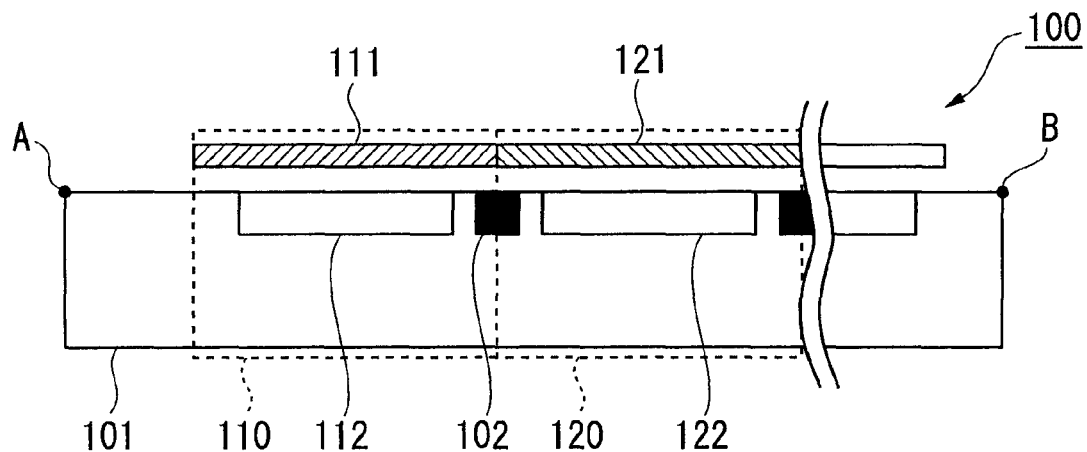
FIG. 2 is a cross-sectional view of the color sensor according to the first embodiment of the present invention.

FIG. 2 is a cross-sectional view of the color sensor according to this embodiment. The shown example shows a cross section taken along line A-B of the color sensor in FIG. 1. In order from the left of the figure, the pixel 110 that detects the long-wavelength light and the pixel 120 that detects the short-wavelength light are shown. A separation layer 102 is shown between the pixel 110 that detects the long-wavelength light and the pixel 120 that detects the short-wavelength light. The separation layer 102 separates the pixel 110 that detects the long-wavelength light and the pixel 120 that detects the short-wavelength light.

The pixel 110 that detects the long-wavelength light includes a second color filter 111 and a second photodiode 112 configured on the silicon substrate 101. The pixel 120 that detects the short-wavelength light includes a first color filter 121 and a first photodiode 122 configured on the silicon substrate 101.

The second color filter 111 is a color filter that transmits the long-wavelength light, and is arranged to cover the pixel 110 that detects the long-wavelength light. The first color filter 121 is a color filter that transmits the short-wavelength light, and is arranged to cover the pixel 120 that detects the short-wavelength light. The second photodiode 112 is a photoelectric conversion element that photoelectrically converts light incident through the second color filter 111. The first photodiode 122 is a photoelectric conversion element that photoelectrically converts light incident through the first color filter 121.

Although not shown, each of the pixels provided in the color sensor 100 has a color filter that transmits a specific wavelength of light and a photodiode configured on the silicon substrate 101 like the pixel 110 that detects the long-wavelength light or the pixel 120 that detects the short-wavelength light. Thereby, each of the pixels provided in the color sensor 100 can photoelectrically convert light incident through the color filter which transmits the specific wavelength of light.

Figure 3:
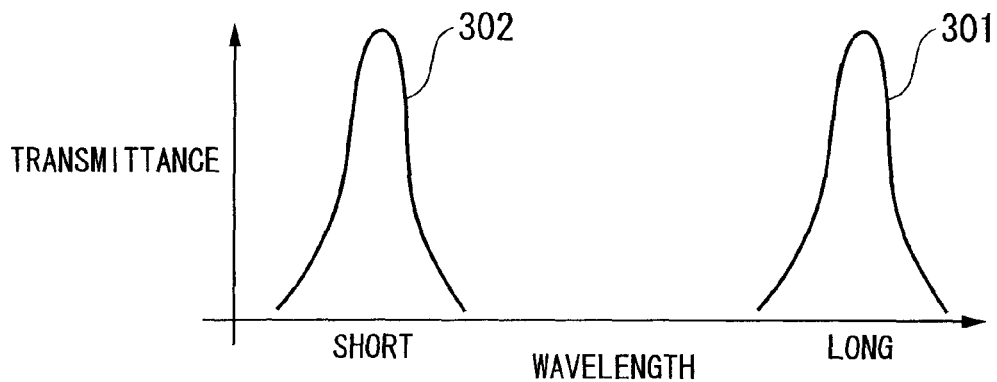
FIG. 3 is a graph showing the light transmittances of a first color filter and a second color filter according to the first embodiment of the present invention.

Next, the light transmittances of the second color filter 111 and the first color filter 121 will be described. FIG. 3 is a graph showing the light transmittances of the second color filter 111 and the first color filter 121 according to this embodiment. In the shown graph, the horizontal axis represents a wavelength of light and the vertical axis represents transmittance of light. A curve 301 represents the light transmittance of the second color filter 111. A curve 302 represents the light transmittance of the first color filter 121.

As shown, the second color filter 111 has high light transmittance for the long-wavelength light. That is, the second color filter 111 has a second transmission band in which the long-wavelength light is transmitted. Accordingly, the pixel 110 that detects the long-wavelength light can detect the long-wavelength light. The first color filter 121 has high light transmittance for the short-wavelength light. That is, the first color filter 121 has a first transmission band in which the short-wavelength light is transmitted. Accordingly, the pixel 120 that detects the short-wavelength light can detect the short-wavelength light.

Next, the relationship between the wavelength of light (incident light) incident to the color sensor 100 and an absorption depth of silicon used in the silicon substrate 101 of the color sensor 100 will be described. A color difference corresponds to a wavelength difference of light.

Figure 4:
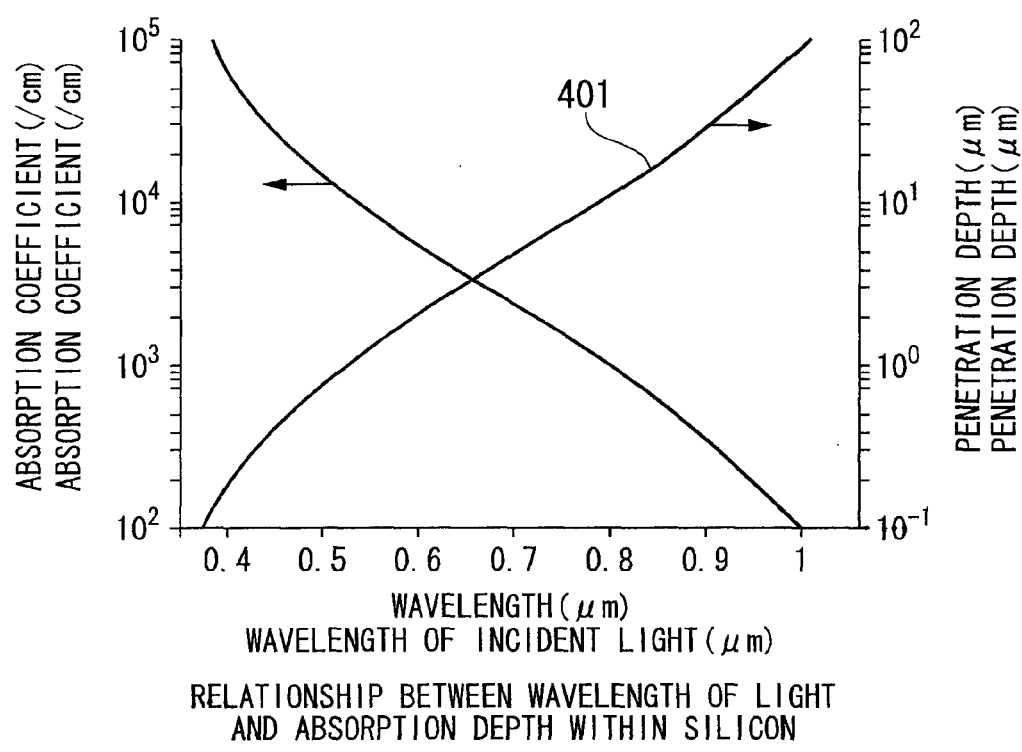
FIG. 4 is a graph showing the relationship of a wavelength of incident light, an absorption depth of silicon, and an absorption coefficient.

FIG. 4 is a graph showing the relationship of a wavelength of incident light, an absorption depth (a penetration depth) of silicon, and an absorption coefficient. As shown, the absorption depth of silicon differs by the wavelength difference of light. For example, a wavelength of blue light is 400 nm to 490 nm. From a curve 401, the absorption depth of silicon for the blue light is 0.2 µm to 0.5 µm. The wavelength of green light is 490 nm to 575 nm. From the curve 401, the absorption depth of silicon for the green light is 0.5 µm to 1.5 µm. The wavelength of red light is 575 nm to 700 nm. From the curve 401, the absorption depth of silicon for the red light is 1.5 µm to 3.0 µm. Thus, the light has a characteristic that the long wavelength is moderately absorbed in a deep position of silicon.

Next, the relationship between the absorption depth of silicon and crosstalk charges occurring in the pixel 110 that detects the long-wavelength light and the pixel 120 that detects the short-wavelength light which are provided in the color sensor 100 will be described.

The second photodiode 112 provided in the pixel 110 that detects the long-wavelength light generates photo charges depending on the amount of light transmitted through the second color filter 111. The first photodiode 122 provided in the pixel 120 that detects the short-wavelength light generates photo charges depending on the amount of light transmitted through the first color filter 121. As described above in this case, the long-wavelength light is moderately absorbed in a deep position of the silicon substrate 101. Thus, the second photodiode 112 provided in the pixel 110 that detects the long-wavelength light generates a photo charge in the deep position of the silicon substrate 101 compared to the first photodiode 122 provided in the pixel 120 that detects the short-wavelength light.

Compared to a photo charge generated in a shallow position of the silicon substrate 101, the photo charge generated in the deep position of the silicon substrate 101 is characterized by easily wrapping around into the silicon substrate 101 of another pixel. Accordingly, the pixel 110 that detects the long-wavelength light easily generates a crosstalk charge compared to the pixel 120 that detects the short-wavelength light.

In the color sensor 100 according to this embodiment, the pixel 110 that detects the long-wavelength light, which easily generates the crosstalk charge, is arranged on an outer side within the light receiving unit 150. In the case where the pixel 110 that detects the long-wavelength light is arranged on the outer side within the light receiving unit 150 compared to the case where the pixel 110 that detects the long-wavelength light, which easily generates the crosstalk charge, is arranged on an inner side within the light receiving unit 150, the ratio at which the crosstalk charge generated by the pixel 110 that detects the long-wavelength light is diffused to the outside of the light receiving unit 150 and not to other pixels is high.

Accordingly as in this embodiment, it is possible to diffuse more crosstalk charges generated by each of the pixels to the outside of the light receiving unit 150 by arranging the pixel 110 that detects the long-wavelength light, which easily generates the crosstalk charge, to the outer side of the light receiving unit 150. Consequently, the color sensor 100 can suppress the degradation of detection accuracy of light components due to the effect of crosstalk, and thus the color sensor 100 can detect the light components with higher accuracy.

In particular, if the pixel 110 that detects the long-wavelength light is arranged on an outermost side within the light receiving unit 150 as shown in FIG. 2, a separation layer does not exist on the periphery of the light receiving unit 150, and the separation layer 102 exists between the pixel 110 and another pixel neighboring thereto. Thus, the crosstalk charge generated by the pixel 110 that detects the long-wavelength light is easily diffused outside the light receiving unit 150 rather than diffused to another neighboring pixel. Consequently, the color sensor 100 can further suppress the degradation of detection accuracy of light components due to the effect of crosstalk, and thus the color sensor 100 can detect the light components with higher accuracy.

Preferably, impurities may be introduced into the silicon substrate 101 so as to adjust the specific resistance of the silicon substrate 101. The impurities decrease the specific resistance of the silicon substrate 101 compared to the case where the impurities are not included. In a specific example, phosphorus or sulfur is introduced at a concentration that is lower than the concentration of the pixel. Thereby, the diffusion speed of crosstalk charges is increased within the silicon substrate 101, and a period in which the crosstalk charges stay within the light receiving unit 150 is shortened. Accordingly, the ratio at which the crosstalk charges are diffused outside the light receiving unit 150 is further increased. Thus, it is possible to diffuse more crosstalk charges generated by the pixels to the outside of the light receiving unit 150. Consequently, the color sensor 100 can further suppress the degradation of detection accuracy of light components due to the effect of crosstalk. Furthermore, the color sensor 100 can accurately detect the light components.

Figure 5:
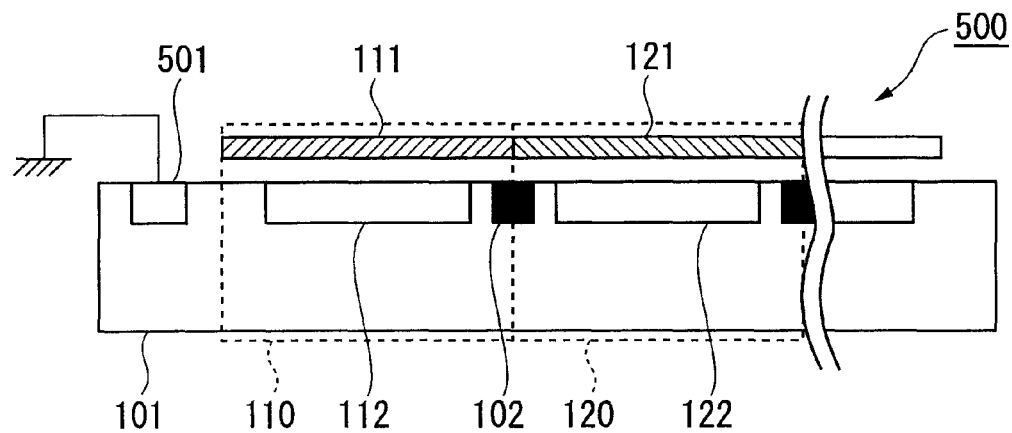
FIG. 5 is a cross-sectional view of a color sensor provided with a ground electrode in the first embodiment of the present invention.

To better discharge the crosstalk charges outside the light receiving unit 150, a ground electrode may be provided on the silicon substrate 101 outside the light receiving unit 150. FIG. 5 is a cross-sectional view of a color sensor 500 provided with the ground electrode in this embodiment. A difference between the shown color sensor 500 and the color sensor 100 shown in FIG. 2 is that the color sensor 500 has a ground electrode 501 provided on the silicon substrate 101 outside the light receiving unit 150. The other configuration of the color sensor 500 is the same as that of the color sensor 100 shown in FIG. 2.

The ground electrode 501 is grounded and discharges crosstalk charges generated by the pixels to the outside of the color sensor 500. Thereby, the crosstalk charges generated by the pixels easily move to the ground electrode 501. Thus, it is possible to diffuse more crosstalk charges generated by the pixels to the outside of the light receiving unit 150. Consequently, the color sensor 500 can suppress the degradation of detection accuracy of light components due to the effect of crosstalk, and thus the color sensor 500 can detect the light components with higher accuracy.

The example in which the pixel No. 5 (a pixel arranged on the outer side) is the pixel 110 that detects the long-wavelength light has been described above, but the present invention is not limited thereto. For example, it is preferable that the pixel No. 5 be a pixel that easily generates a crosstalk charge compared to another pixel such as a pixel (a second pixel) that detects infrared light and medium-wavelength light or a pixel (a second pixel) that detects long-wavelength light and medium-wavelength light.

Figure 6:
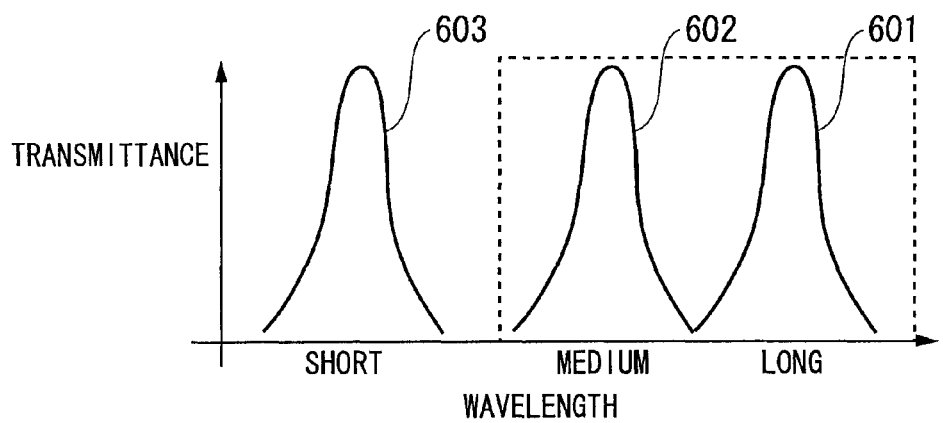
FIG. 6 is a graph showing the light transmittances of a color filter provided in a pixel which detects infrared light and medium-wavelength light and of a second color filter.

FIG. 6 is a graph showing light transmittances of a color filter (a second color filter) provided in a pixel which detects infrared light and medium-wavelength light and of the first color filter 121. In the shown graph, the horizontal axis represents a wavelength of light and the vertical axis represents transmittance of light. Curves 601 and 602 represent the light transmittances of the color filter provided in the pixel that detects the infrared light and the medium-wavelength light. A curve 603 represents the light transmittance of the first color filter 121.

As shown, the color filter provided in the pixel which detects the infrared light and the medium-wavelength light has high light transmittances for the infrared light and the medium-wavelength light. That is, the color filter provided in the pixel which detects the infrared light and the medium-wavelength light has a second transmission band in which the infrared light is transmitted and a third transmission band in which the medium-wavelength light is transmitted. The first color filter 121 has high light transmittance for the short-wavelength light. That is, the first color filter 121 has a first transmission band in which the short-wavelength light is transmitted.

Accordingly, the pixel 120 that detects the short-wavelength light can detect the short-wavelength light.

Since the pixel that detects the infrared light and the medium-wavelength light detects the infrared light (long-wavelength light) and the medium-wavelength light, the pixel generates a crosstalk charge more easily than the pixel 120 that detects the short-wavelength light. As described above, the pixel that detects the infrared light and the medium-wavelength light, which easily generates a crosstalk charge, is arranged on an outer side within the light receiving unit 150. Thus, in the case where the pixel that detects the infrared light and the medium-wavelength light is arranged on the outer side within the light receiving unit 150 compared to the case where the pixel that detects the infrared light and the medium-wavelength light is arranged on an inner side within the light receiving unit 150, a ratio at which the crosstalk charge generated by the pixel that detects the infrared light and the medium-wavelength light is diffused to the outside of the light receiving unit 150 and is not diffused to other pixels is high. Accordingly, it is possible to diffuse more crosstalk charges generated by the pixels to the outside of the light receiving unit 150. Thereby, even when the pixel that detects the infrared light and the medium-wavelength light is provided, the color sensor 100 can suppress the degradation of detection accuracy of light components due to the effect of crosstalk, and thus the color sensor 100 can detect the light components with higher accuracy.

Figure 7:
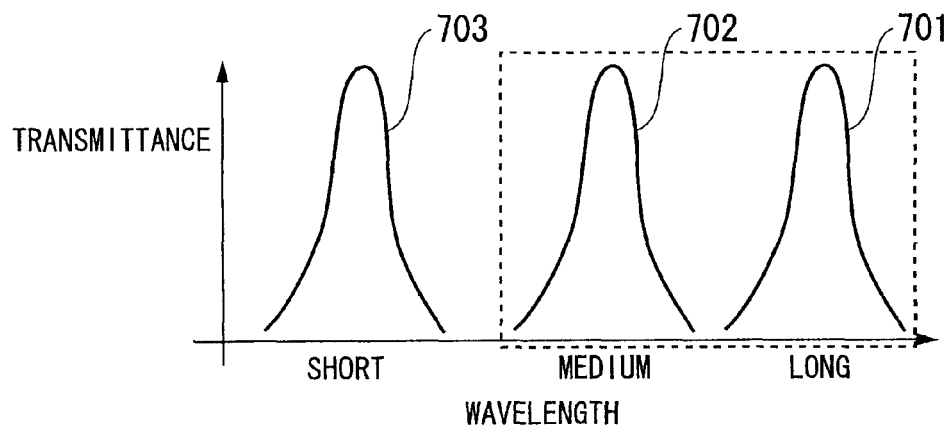
FIG. 7 is a graph showing the light transmittances of color filters provided in a pixel which detects long-wavelength light and medium-wavelength light and of a second color filter.

FIG. 7 is a graph showing the light transmittances of color filters provided in a pixel that detects long-wavelength light and medium-wavelength light and the first color filter 121. In the shown graph, the horizontal axis represents a wavelength of light and the vertical axis represents transmittance of light. Curves 701 and 702 represent the light transmittances of the color filters provided in the pixel that detects the long-wavelength light and the medium-wavelength light. A curve 703 represents the light transmittance of the first color filter 121.

In the color filters provided in the pixel that detects the long-wavelength light and the medium-wavelength light, the light transmittances shown in FIG. 7 may be implemented by overlapping a color filter (a second color filter) having a second transmission band and a color filter (a third color filter) having a transmission band with a wavelength that is shorter than that of the second transmission band.

As shown, the color filters provided in the pixel that detects the long-wavelength light and the medium-wavelength light have high light transmittances for the long-wavelength light and for the medium-wavelength light. That is, the color filters provided in the pixel that detects the long-wavelength light and the medium-wavelength light have the second transmission band in which the long-wavelength light is transmitted, and the transmission band in which the medium-wavelength light is transmitted and having a shorter wavelength than the second transmission band. Also, the first color filter 121 has high light transmittance for the short-wavelength light. That is, the first color filter 121 has the first transmission band in which the short-wavelength light is transmitted. Accordingly, the pixel 120, which detects the short-wavelength light, can detect the short-wavelength light.

Since the pixel that detects the long-wavelength light and the medium-wavelength light detects the long-wavelength light and the medium-wavelength light, the pixel generates a crosstalk charge more easily than the pixel 120 that detects the short-wavelength light. As described above, the pixel which detects the long-wavelength light and the medium-wavelength light, and which easily generates a crosstalk charge, is arranged on an outer side within the light receiving unit 150. Thus, in the case where the pixel which detects the long-wavelength light and the medium-wavelength light is arranged on the outer side within the light receiving unit 150 compared to the case where the pixel which detects the long-wavelength light and the medium-wavelength light is arranged on an inner side within the light receiving unit 150, the ratio at which the crosstalk charge generated by the pixel that detects the long-wavelength light and at which medium-wavelength light is diffused to the outside of the light receiving unit 150 and is not diffused to other pixels is high. Accordingly, it is possible to diffuse more crosstalk charges generated by the pixels to the outside of the light receiving unit 150. Thereby, even when the pixel which detects the long-wavelength light and the medium-wavelength light which has a plurality of transmission bands is provided with, the color sensor 100 can suppress the degradation of detection accuracy of light components due to the effect of crosstalk, and thus the color sensor 100 can detect the light components with higher accuracy.

In this embodiment, the relationship between the pixel No. 5 and the pixel No. 6 among the pixel No. 1 to 16 provided in the color sensor 100 has been described. However, other pixels may also be arranged within the light receiving unit 150 according to a wavelength of light to be detected by each pixel. For example, pixels that detect long-wavelength components and generate many crosstalk charges may be moderately arranged on an outer side position in the light receiving unit 150.

Second Embodiment

Figure 8:
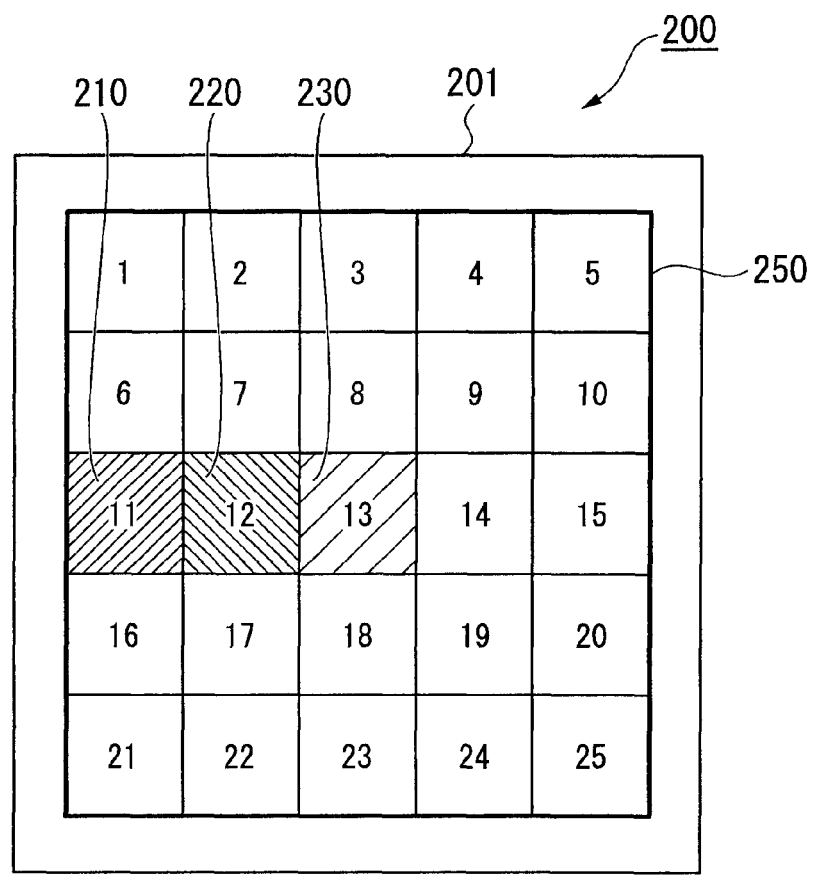
FIG. 8 is a schematic diagram showing an arrangement of pixels provided in a color sensor according to a second embodiment of the present invention.

Hereinafter, the second embodiment of a color sensor of the present invention will be described with reference to the drawings. FIG. 8 is a schematic diagram illustrating an arrangement of pixels provided in the color sensor according to this embodiment. In an example shown, a color sensor 200 has 25 pixels provided on a silicon substrate 201. A region where the 25 pixels are provided becomes a light receiving unit 250.

In this description, numbers from No. 1 to No. 25 in order from top left to bottom right are each assigned to the pixels provided in the shown color sensor 200. Specifically, the top-left pixel number is No. 1, and the pixel number of the pixel next to and to the right of the pixel No. 1 is No. 2. Other pixel numbers are as shown.

In the shown example, a pixel No. 11 is a pixel 210 (a second pixel), which detects long-wavelength light. Pixel No. 12 is a pixel 220 (a third pixel) which detects medium-wavelength light. Pixel No. 13 is a pixel 230 (a first pixel) which detects short-wavelength light.

Thus, the pixel 210 that detects the long-wavelength light is arranged on a more outer side within the light receiving unit 250 than the pixel 220 that detects the medium-wavelength light and the pixel 230 that detects the short-wavelength light. Also, the pixel 220 that detects the medium-wavelength light is arranged on a more outer side within the light receiving unit 250 than the pixel 230 that detects the short-wavelength light. Pixels Nos. 1 to 10 and Nos. 14 to 25 are pixels that respectively detect specific wavelength lights.

The pixel 210 that detects the long-wavelength light includes a color filter (a second color filter) that transmits the long-wavelength light and a photodiode configured on a silicon substrate 201. The pixel 220 that detects the medium-wavelength light includes a color filter (a third color filter) that transmits the medium-wavelength light and a photodiode configured on the silicon substrate 201. The pixel 230 that detects the short-wavelength light includes a color filter (a first color filter) that transmits the short-wavelength light and a photodiode configured on the silicon substrate 201. Likewise, other pixels provided in the color sensor 200 respectively include color filters that transmit specific wavelengths of light and photodiodes configured on the silicon substrate 201.

Figure 9:
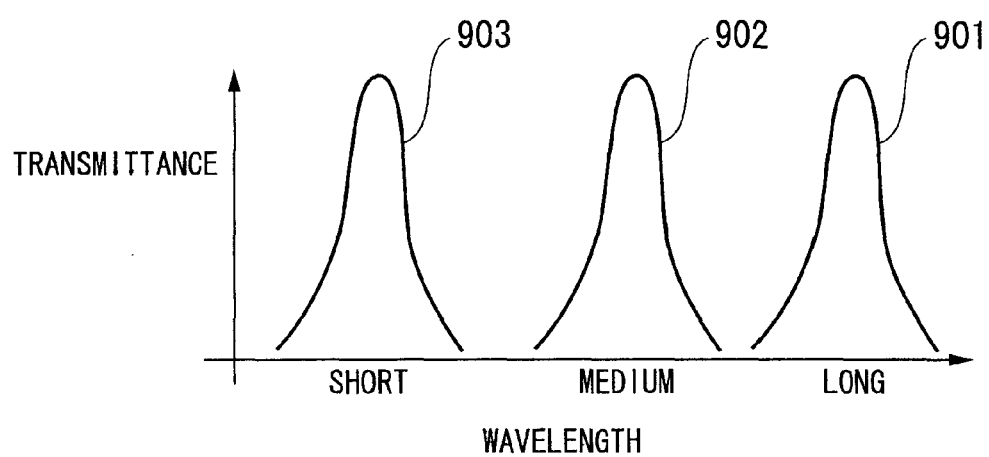
FIG. 9 is a graph showing the light transmittances of a color filter that transmits long-wavelength light, a color filter that transmits medium-wavelength light, and a color filter that transmits short-wavelength light in the second embodiment of the present invention.

Next, the light transmittances of the color filter that transmits the long-wavelength light, the color filter that transmits the medium-wavelength light, and the color filter that transmits the short-wavelength light will be described. FIG. 9 is a graph showing the light transmittances of the color filter that transmits the long-wavelength light, the color filter that transmits the medium-wavelength light, and the color filter that transmits the short-wavelength light in this embodiment. In the shown graph, the horizontal axis represents the wavelength of light and the vertical axis represents the transmittance of light. A curve 901 represents the light transmittance of the color filter that transmits the long-wavelength light. A curve 902 represents the light transmittance of the color filter that transmits the medium-wavelength light. A curve 903 represents the light transmittance of the color filter that transmits the short-wavelength light.

As shown, the color filter that transmits the long-wavelength light has high light transmittance for the long-wavelength light. That is, the color filter that transmits the long-wavelength light has a second transmission band in which the long-wavelength light is transmitted. Accordingly, the pixel 210 that detects the long-wavelength light can detect the long-wavelength light. Also, the color filter that transmits the medium-wavelength light has high light transmittance for the medium-wavelength light. That is, the color filter that transmits the medium-wavelength light has a third transmission band in which the medium-wavelength light is transmitted. Accordingly, the pixel 220 that detects the medium-wavelength light can detect the medium-wavelength light. Also, the color filter that transmits the short-wavelength light has high light transmittance for the short-wavelength light. That is, the color filter that transmits the short-wavelength light has a first transmission band in which the short-wavelength light is transmitted. Accordingly, the pixel 230 that detects the short-wavelength light can detect the short-wavelength light.

Since the pixel 210, which detects the long-wavelength light, detects the long-wavelength light, the pixel 210 generates a crosstalk charge more easily than the pixel 220 that detects the medium-wavelength light or the pixel 230 that detects the short-wavelength light. Also, since the pixel 220, which detects the medium-wavelength light, detects the medium-wavelength light, the pixel 220 generates a crosstalk charge more easily than the pixel 230 that detects the short-wavelength light.

Thus, in the case where the pixel 210 that detects the long-wavelength light is arranged on a more outer side within the light receiving unit 250 than the pixel 220 that detects the medium-wavelength light or the pixel 230 that detects the short-wavelength light compared to the case where the pixel 210 that detects the long-wavelength light is arranged on a more inner side within the light receiving unit 250 than the pixel 220 that detects the medium-wavelength light or the pixel 230 that detects the short-wavelength light, a ratio at which the crosstalk charge generated by the pixel 210 that detects the long-wavelength light is diffused to the outside of the light receiving unit 250 and is not diffused to other pixels is high.

Also, in the case where the pixel 220 that detects medium-wavelength light is arranged on a more outer side within the light receiving unit 250 than the pixel 230 that detects the short-wavelength light compared to the case where the pixel 220 that detects the medium-wavelength light is arranged on a more outer side within the light receiving unit 250 than the pixel 230 that detects the short-wavelength light, the ratio at which the crosstalk charge generated by the pixel 220 that detects the medium-wavelength light is diffused to the outside of the light receiving unit 250 and is not diffused to other pixels is high.

Accordingly, in this embodiment, pixels are arranged from an outer side within the light receiving unit 250 in order a crosstalk charge is easily generated, so that more crosstalk charges generated by the pixels can be diffused outside the light receiving unit 250. Consequently, even when a plurality of pixels having different transmission bands are provided, the color sensor 200 can suppress the degradation of detection accuracy of light components due to the effect of crosstalk, and thus the color sensor 200 can detect the light components with higher accuracy.

In this embodiment, the relationship of the pixel No. 11, the pixel No. 12, and the pixel No. 13 among the pixels Nos. 1 to 25 provided in the color sensor 200 has been described. However, other pixels may also be arranged within the light receiving unit 250 according to a wavelength of light detected by each pixel. For example, pixels that detect long-wavelength components and generate many crosstalk charges may be moderately arranged on an outer side within the light receiving unit 250.

Third Embodiment

Figure 10:
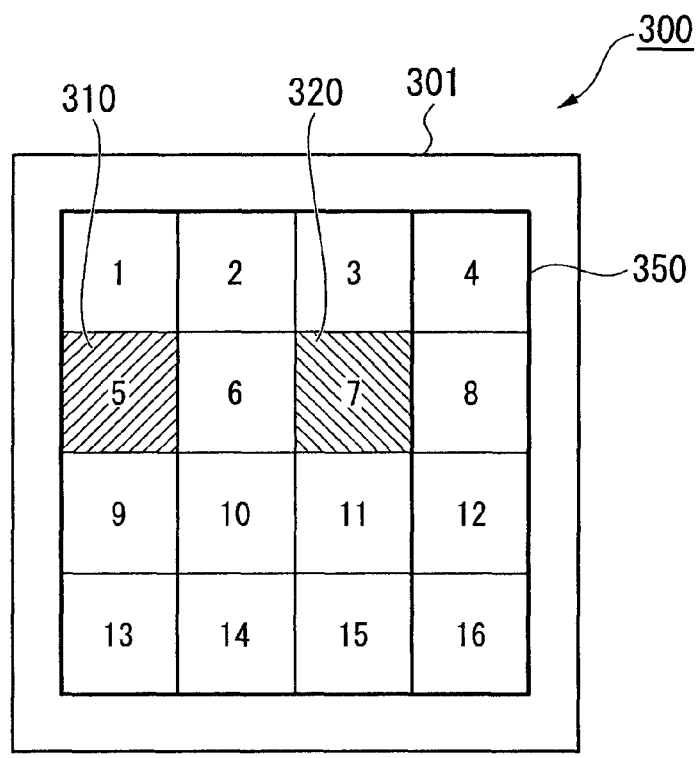
FIG. 10 is a schematic diagram showing an arrangement of pixels provided in a color sensor according to a third embodiment of the present invention.

Hereinafter, the third embodiment of a color sensor of the present invention will be described with reference to the drawings. FIG. 10 is a schematic diagram illustrating an arrangement of pixels provided in the color sensor according to this embodiment. In an example shown, a color sensor 300 has 16 pixels provided on a silicon substrate 301. A region where the 16 pixels are provided becomes a light receiving unit 350.

In this description, numbers from No. 1 to No. 16 in order from top left to bottom right are each assigned to the pixels provided in the shown color sensor 300. Specifically, the top-left pixel number is No. 1, and pixel number of the pixel next to and to the right of the pixel No. 1 is No. 2. Other pixel numbers are as shown.

In the shown example, a pixel No. 5 is a pixel 310, which detects high-sensitivity and long-wavelength light. The pixel 310, which detects the high-sensitivity and long-wavelength light, detects the long-wavelength light and has high light detection sensitivity. A pixel No. 7 is a pixel 320 that detects low-sensitivity and short-wavelength light. The pixel 320, which detects the low-sensitivity and short-wavelength light, detects the short-wave light and has low light detection sensitivity.

Thus, the pixel 310 that detects the high-sensitivity and long-wavelength light is arranged on a more outer side within the light receiving unit 350 than the pixel 320 that detects the low sensitivity and short-wavelength light. The pixel 310 that detects the high-sensitivity and long-wavelength light and the pixel 320 that detects the low sensitivity and short-wavelength light are arranged in separated positions. The pixels Nos. 1 to 4, 6, and 8 to 16 are pixels that respectively detect specific wavelengths of light.

The pixel 310 that detects the high-sensitivity and long-wavelength light includes a color filter (a second color filter) that transmits the long-wavelength light and a photodiode configured on the silicon substrate 301. The pixel 320 that detects the low-sensitivity and short-wavelength light includes a color filter (a first color filter) that transmits the short-wavelength light and a photodiode configured on the silicon substrate 301. Likewise, other pixels provided in the color sensor 300 each include color filters that transmit specific wavelength lights and photodiodes configured on the silicon substrate 301.

Figure 11:
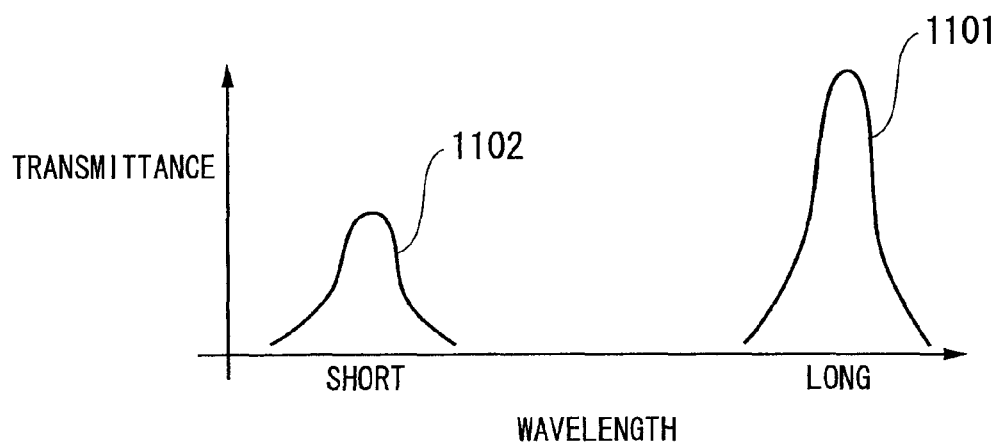
FIG. 11 is a graph showing the light transmittances of a color filter that transmits long-wavelength light and a color filter that transmits short-wavelength light according to the third embodiment of the present invention.

Next, the light transmittances of the color filter that transmits the long-wavelength light and the color filter that transmits the short-wavelength light will be described. FIG. 11 is a graph showing the light transmittances of the color filter that transmits the long-wavelength light and the color filter that transmits the short-wavelength light in this embodiment. In the shown graph, the horizontal axis represents a wavelength of light and the vertical axis represents the transmittance of light. A curve 1101 represents the light transmittance of the color filter that transmits the long-wavelength light. A curve 1102 represents the color filter that transmits the short-wavelength light.

As shown, the color filter that transmits the long-wavelength light has high light transmittance for the long-wavelength light. That is, the color filter that transmits the long-wavelength light has a second transmission band in which the long-wavelength light is transmitted. Accordingly, the pixel 310 that detects the long-wavelength light can detect the long-wavelength light. Also, the color filter that transmits the short-wavelength light has high light transmittance for the short-wavelength light. That is, the color filter that transmits the short-wavelength light has a first transmission band in which the short-wavelength light is transmitted. Accordingly, the pixel 320 that detects the short-wavelength light can detect the short-wavelength light.

The transmittance of the short-wavelength light of the color filter that transmits the short-wavelength light is lower than that of the long-wavelength light of the color filter that transmits the long-wavelength light. Specifically, the transmittance of the short-wavelength light of the color filter that transmits the short-wavelength light is half of the transmittance of the long-wavelength light of the color filter that transmits the long-wavelength light. Accordingly, the pixel 310 that detects the high-sensitivity and long-wavelength light has a higher sensitivity than the pixel 320 that detects the low-sensitivity and short-wavelength light.

Since the pixel 310 that detects the high-sensitivity and long-wavelength light detects the long-wavelength light, the pixel 310 generates a crosstalk charge more easily than the pixel 320 that detects the low-sensitivity and short-wavelength light. Also, since the pixel 310 that detects the high-sensitivity and long-wavelength light has a higher sensitivity than the pixel 320 that detects the low-sensitivity and short-wavelength light, the pixel 310 generates a crosstalk charge more easily than the pixel 320 that detects the low-sensitivity and short-wavelength light.

Thus, in the case where the pixel 310 that detects the high-sensitivity and long-wavelength light is arranged on a more outer side within the light receiving unit 350 than the pixel 320 that detects the low-sensitivity and short-wavelength light compared to the case where the pixel 310 that detects the high-sensitivity and long-wavelength light is arranged on a more inner side within the light receiving unit 350 than the pixel 320 that detects the low-sensitivity and short-wavelength light, the ratio at which the crosstalk charge generated by the pixel 310 that detects the high-sensitivity and long-wavelength light is diffused to the outside of the light receiving unit 350 and is not diffused to other pixels is high.

Compared to a high-sensitivity pixel, a low-sensitivity pixel generates a small amount of charges depending on incident light. Consequently, compared to the high-sensitivity pixel, the low-sensitivity pixel is further affected by the effect of a crosstalk charge. In this embodiment, the pixel 310 that detects the high-sensitivity and long-wavelength light and the pixel 320 that detects the low-sensitivity and short-wavelength light are arranged to be separated. Thus, the crosstalk charge generated by the pixel 310 that detects the high-sensitivity and long-wavelength light can be prevented from affecting the pixel 320 that detects the low-sensitivity and short-wavelength light.

Accordingly, as in this embodiment, the pixel 310 that detects the high-sensitivity and long-wavelength light and the pixel 320 that detects the low-sensitivity and short-wavelength light are arranged to be separated, so that the crosstalk charge generated by the pixel 310 that detects the high-sensitivity and long-wavelength light can be prevented from affecting the pixel 320 that detects the low-sensitivity and short-wavelength light. Consequently, the color sensor 300 can suppress the degradation of detection accuracy of light components due to the effect of crosstalk, and thus the color sensor 300 can detect the light components with higher accuracy.

In this embodiment, the relationship between the pixel No. 5 and the pixel No. 7 among the pixels Nos. 1 to 16 provided in the color sensor 300 has been described. However, other pixels may also be arranged within the light receiving unit 350 depending on the sensitivity of each pixel. For example, a high-sensitivity pixel and a low-sensitivity pixel may be arranged to be separated within the light receiving unit 350.

Fourth Embodiment

Figure 12:
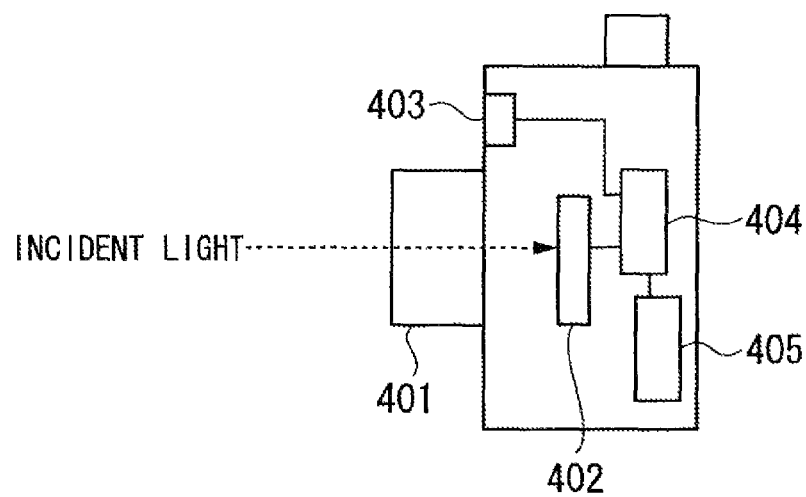
FIG. 12 is a schematic diagram showing the configuration of an imaging device according to a fourth embodiment of the present invention.
Figure 13:
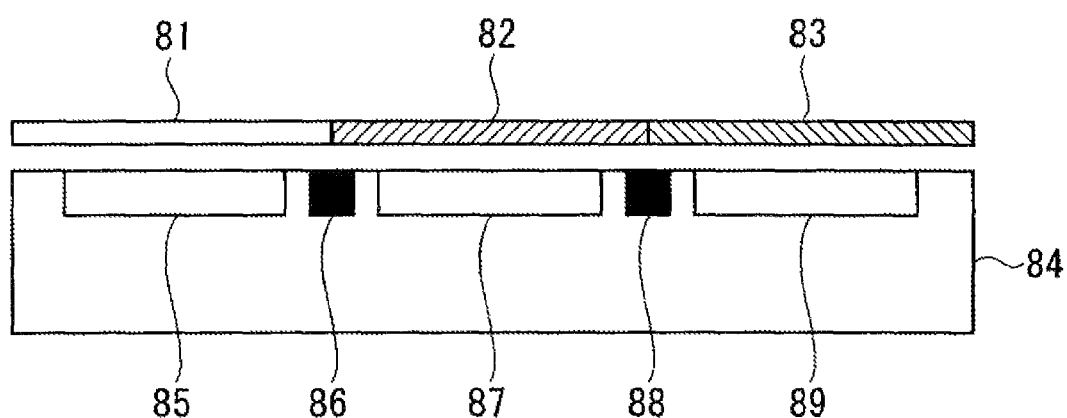
FIG. 13 is a cross-sectional view of a color sensor of the related art.
Figure 14:
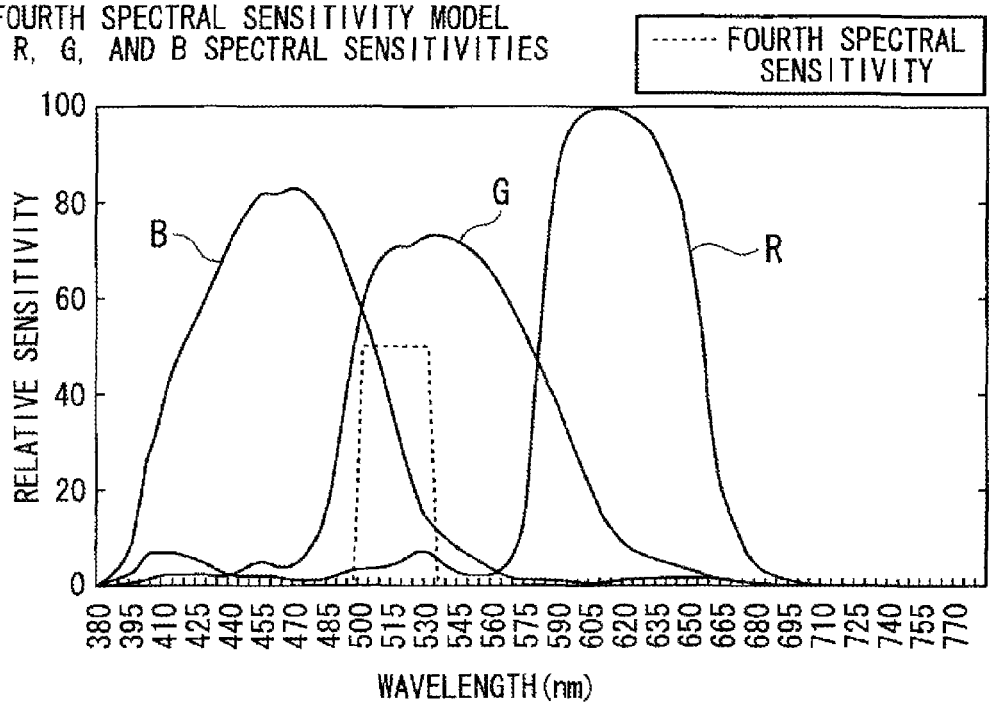
FIG. 14 is a graph showing relative sensitivity of light.
Figure 15:
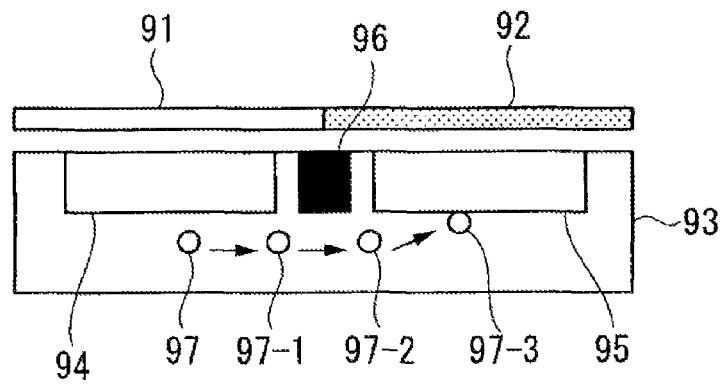
FIG. 15 is a schematic diagram illustrating crosstalk occurring in a photoelectric conversion element of the color sensor.

Next, the fourth embodiment in which a color sensor of the present invention is mounted on an imaging device will be described with reference to the drawing. FIG. 12 is a schematic diagram showing the configuration of the imaging device according to this embodiment. In the shown example, an imaging device 400 includes an imaging lens 401, a solid-state imaging element 402, a color sensor 403, a central processing unit (CPU) 404, and a white balance control unit 405.

The imaging lens 401 forms an image of a subject on the solid-state imaging element 402. The solid-state imaging element 402 photoelectrically converts the formed subject image into a video signal. The color sensor 403 detects a component of incident light (the intensity of light of each wavelength included in the incident light). The color sensor 403 according to this embodiment is the color sensor described in the first to third embodiments.

The CPU 404 identifies a type of light source (for example, sunlight or light of a fluorescent lamp) irradiated to the subject on the basis of the component of incident light detected by the color sensor 403. The white balance control unit 405 automatically adjusts the white balance of the video signal photoelectrically converted by the solid-state imaging element 402 depending on the type of light source identified by the CPU 404.

The color sensor described in the first to third embodiments is used as the color sensor 403 according to this embodiment. Consequently, the color sensor 403 can suppress the degradation of detection accuracy of light components due to the effect of crosstalk, and thus the color sensor 403 can detect the light components with higher accuracy. Accordingly, the CPU 404 can identify the type of light source with higher accuracy on the basis of the component of incident light detected by the color sensor 403. Thereby, the accuracy of automatic adjustment of the white balance by the white balance control unit 405 is further improved.

The first to fourth embodiments of the present invention have been described in detail with reference to the drawings.

However, specific configurations are not limited to the embodiments and may include any design in the scope without departing from the subject matter of the present invention.

The invention claimed is:

1. A color sensor comprising:
a silicon substrate having a principal surface and a side surface;
a plurality of pixels arranged in matrix, the matrix having a row in which pixels are arranged along a first straight line and a column in which pixels are arranged along a second straight line perpendicular to the first straight line;
wherein the plurality of pixels comprise:
a first pixel provided in a sensor unit formed on the principal surface of the silicon substrate and having a first color filter; and
a second pixel provided in the sensor unit formed on the principal surface of the silicon substrate, provided in a position closer to an outer edge of the sensor unit than the first pixel, and having a second color filter,
wherein a longest-wavelength transmission band of the first color filter is a first transmission band,
wherein a longest-wavelength transmission band of the second color filter is a second transmission band,
wherein the second transmission band has a longer wavelength than the first transmission band,
wherein an internal pixel is provided in the sensor unit formed on the principal surface of the silicon substrate, is provided in a position farther from the outer edge of the sensor unit than the first pixel, and has an internal color filter,
wherein the first pixel, the second pixel and the internal pixel are provided in the row, as viewed from a point on a line perpendicular to the principal surface of the silicon substrate, wherein in the internal pixel, a longest-wavelength transmission band of the internal color filter is shorter than that of the second transmission band, and
wherein the second color filter further has a third transmission band, and the third transmission band has a shorter wavelength than the second transmission band.

2. The color sensor according to claim 1, wherein transmittance of the first color filter is lower than that of the second color filter.

3. The color sensor according to claim 1, wherein impurities are included in the silicon substrate, and the impurities decrease specific resistance of the silicon substrate compared to the case where the impurities are not included.

4. A color sensor comprising:
a silicon substrate having a principal surface and a side surface;
a plurality of pixels arranged in matrix, the matrix having a row in which pixels are arranged along a first straight line and a column in which pixels are arranged along a second straight line perpendicular to the first straight line;
wherein the plurality of pixels comprise:
a first pixel provided in a sensor unit formed on the principal surface of the silicon substrate and having a first color filter; and
a second pixel provided in the sensor unit formed on the principal surface of the silicon substrate, provided in a position closer to an outer edge of the sensor unit than the first pixel, and having a second color filter,
wherein a longest-wavelength transmission band of the first color filter is a first transmission band,
wherein a longest-wavelength transmission band of the second color filter is a second transmission band, wherein the second transmission band has a longer wavelength than the first transmission band, wherein an internal pixel is provided in the sensor unit formed on the principal surface of the silicon substrate, is provided in a position farther from the outer edge of the sensor unit than the first pixel, and has an internal color filter, wherein the first pixel, the second pixel and the internal pixel are provided in the row, as viewed from a point on a line perpendicular to the principal surface of the silicon substrate, wherein in the internal pixel, a longest-wavelength transmission band of the internal color filter is shorter than that of the second transmission band, and wherein the second pixel further has a third color filter arranged to overlap the second color filter, and a transmission band of the third color filter has a shorter wavelength than the second transmission band.

5. The color sensor according to claim 4, wherein transmittance of the first color filter is lower than that of the second color filter.

6. The color sensor according to claim 4, wherein impurities are included in the silicon substrate, and the impurities decrease specific resistance of the silicon substrate compared to the case where the impurities are not included.

* * * * *